United States Patent [19]

Turnbull

[11] 4,286,034

[45] Aug. 25, 1981

[54] PHOTOCONDUCTIVE STRUCTURES

[75] Inventor: Andrew A. Turnbull, Reigate, England

[73] Assignee: U.S. Philips Corporation, New York, N.Y.

[21] Appl. No.: 83,921

[22] Filed: Oct. 11, 1979

[30] Foreign Application Priority Data

Oct. 26, 1978 [GB] United Kingdom ............... 41981/78

[51] Int. Cl.³ ............................................. G03G 5/04
[52] U.S. Cl. ...................................... 430/63; 430/60; 430/64; 430/94
[58] Field of Search ......................... 430/63, 60, 94, 64

[56] References Cited

U.S. PATENT DOCUMENTS

| 3,379,527 | 4/1968 | Corrsin et al. | 430/94 |
| 3,704,265 | 11/1972 | Nakamura et al. | 430/94 |
| 3,743,609 | 7/1973 | Hirata et al. | 430/94 |
| 3,745,005 | 7/1973 | Yoerger et al. | 430/64 |

FOREIGN PATENT DOCUMENTS

| 2165295 | 8/1972 | Fed. Rep. of Germany | 430/58 |
| 45-38667 | of 1970 | Japan | 430/64 |

Primary Examiner—Mary F. Downey
Attorney, Agent, or Firm—Thomas A. Briody; Robert T. Mayer; Paul R. Miller

[57] ABSTRACT

A photoconductive structure comprises an electrically insulating substrate bearing an evaporated metal electrode pattern, and a 60 to 150 nm thick polyimide film disposed between a sintered cadmium selenide layer and the substrate with the superposed electrode pattern. In the absence of the polyimide film, there had been unacceptable attack of the electrode structure and of silica substrates by the cadmium selenide.

2 Claims, 1 Drawing Figure

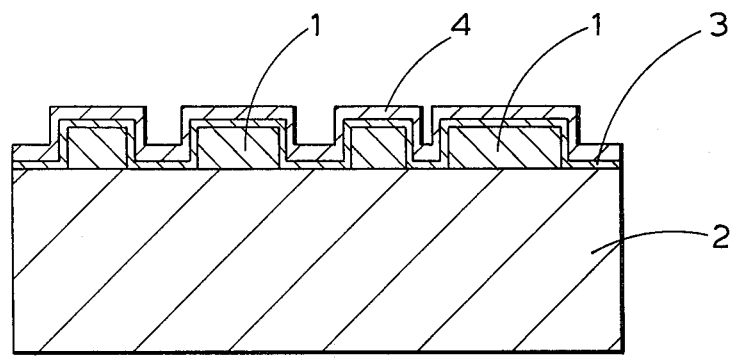

PHOTOCONDUCTIVE STRUCTURES

The invention relates to photoconductive structures comprising sintered cadmium selenide powder layers. These structures are suitable for use in pyroelectric imaging devices, for example infra-red responsive camera tubes.

When cadmium selenide powder layers are sintered, it is necessary to heat the layers to temperatures in the region of 600° C. During the investigations which led to the present invention, it was found that when a substrate bearing a vapour-deposited electrode pattern with a superposed cadmium selenide powder layer was heated to 600° C. in order to sinter the powder layer, the electrode pattern often became detached from the substrate. When the substrate consisted of silica, it appeared by reason of the strong adhesion existing between the sintered layer and the silica substrate, that the silica had been attacked by the cadmium selenide during the sintering process. The problems of detachment of the electrodes from the substrate, and attack of silica substrates during the sintering process, do not occur during the manufacture of similar photoconductive structures in which the photoconductive material is cadmium sulphide, but the performance of pyroelectric imaging devices using cadmium selenide as the photoconductive material is significantly superior to the performance of similar devices using cadmium sulphide as the photoconductive material.

An object of the invention is to provide photoconductive structures including a sintered cadmium selenide powder layer in which the above-mentioned problems do not occur.

The invention provides a photoconductive structure comprising an electrically insulating substrate bearing an evaporated metal pattern, and a 60 to 150 nm thick polyimide film disposed between a sintered cadmium selenide layer and the substrate with the superposed evaporated metal electrode pattern. The substrate may consist, for example, of silica.

It was found that the sintered cadmium selenide layer could be formed in photoconductive structures according to the invention, due to the presence of the polyimide film, without any significant chemical attack of the electrodes and without causing the electrodes to be detached from the substrate. Although polyimide is usually regarded as having extremely good electrical insulating properties, it was found that the thin polyimide film in the photoconductive structure according to the invention was electrically conducting in a direction which is normal to the surface of the film.

An embodiment of the invention will now be described with reference to the following Example and to the drawing, the single FIGURE of which is a diagrammatic sectional elevation of a photoconductive structure according to the invention.

EXAMPLE

An interdigitated platinum electrode structure 1 which was 200 nm thick was evaporated on a 1 mm thick fused silica substrate 2. A drop of a solution of one volume polyimide-based lacquor PYRE-ML (Trade Mark) wire enamel with three volumes of N-methyl-2-pyrrolidone was applied to the substrate 2, which was spun at 4,000 r.p.m. in air for 1 minute while being dried by means of a hair drier. The assembly was then heated in air at 70° C. for 15 minutes, followed by being heated at 600° C. for 2 minutes in a current of nitrogen, so as to form a 100 nm thick polyimide film 3. The suspension of cadmium selenide powder was formed by mixing 1 g of cadmium selenide powder with 100 mls of iso-propanol, and this mixture was ultrasonically agitated for 15 minutes. The agitated mixture was allowed to stand for 10 minutes, and 50 mls of the resultant liquid was taken and used as a stock suspension. One volume of the stock suspension was diluted with 4 volumes of iso-propanol to provide the cadmium selenide suspension used. A 5 $\mu$m thick powder layer of cadmium selenide was formed on the polyimide film 3 by applying the suspension of cadmium selenide powder (average particle size 0.5 $\mu$m) in iso-propanol to the polyimide film 3, and centrifuging the assembly at 2000 r.p.m. for 1 minute. A sintered cadmium selenide layer 4 was formed by heating the assembly at 600° C. for 2 minutes in a current of nitrogen. The cadmium selenide layer 4 was then wetted with an aqueous solution containing 5.88% by weight of $CdCl_2$: the excess solution being spun off at 400 r.p.m. for ¼ minute. The assembly is treated with the cadmium chloride solution before a subsequent treatment to promote binding between the cadmium selenide particles, since cadmium chloride acts as a flux, and also to improve the conductivity of the cadmium selenide layer, since chlorine acts as a donor-type impurity. The assembly was heated at 600° C. for 4 minutes in a current of nitrogen. The cadmium selenide layer 4 was then wetted with a 0.0001 M solution of cupric chloride, and the excess solution was removed by spinning at 400 r.p.m. for ¼ minute. The assembly was then fired at 600° C. in a nitrogen stream for 1¼ minutes in order to diffuse copper into the cadmium selenide layer 4.

It was found that there was good electrical contact between the electrode structure 1 and the cadmium selenide layer 4. The polyimide film 3 behaved in its thickness direction as a material having a resistivity of less than $1.5 \times 10^6 \Omega cm$, but in the plane of the film, as a material having a resistivity of more than $3 \times 10^{10} \Omega cm$.

I claim:

1. A photoconductive structure comprising an electrically insulating substrate, an evaporated metal electrode pattern on said substrate, a 60 to 150 nm thick polyimide film overlying said substrate and said electrode pattern, and a sintered cadmium selenide layer on said polyimide film.

2. A photoconductive structure according to claim 1, wherein said substrate consists of silica.

* * * * *